(12) United States Patent
Wang et al.

(10) Patent No.: US 8,736,117 B2
(45) Date of Patent: May 27, 2014

(54) SERVER RACK SYSTEM

(75) Inventors: Shi-Feng Wang, Shanghai (CN);
Ji-Peng Xu, Shanghai (CN); Tsai-Kuei Cheng, Taipei (TW)

(73) Assignee: Inventec Corporation, Taipei (TW)

( * ) Notice: Subject to any disclaimer, the term of this patent is extended or adjusted under 35 U.S.C. 154(b) by 572 days.

(21) Appl. No.: 13/171,814

(22) Filed: Jun. 29, 2011

(65) Prior Publication Data

US 2012/0262865 A1   Oct. 18, 2012

(30) Foreign Application Priority Data

Apr. 13, 2011  (CN) .......................... 2011 1 0097513

(51) Int. Cl.
*H01B 11/02* (2006.01)
*H02B 1/20* (2006.01)
*H02G 5/06* (2006.01)

(52) U.S. Cl.
USPC ........................................................ 307/147

(58) Field of Classification Search
CPC ....... G06F 1/188; G06F 1/189; H05K 7/1492; H05K 7/1498
USPC ............... 307/147; 361/687, 688, 694, 679.4, 361/702–704; 713/300, 323
See application file for complete search history.

(56) References Cited

U.S. PATENT DOCUMENTS

| | | | |
|---|---|---|---|
| 7,420,805 B2 * | 9/2008 | Smith et al. ............... | 361/679.48 |
| 7,646,590 B1 * | 1/2010 | Corhodzic et al. ............ | 361/641 |
| 2008/0007909 A1 * | 1/2008 | Merkin et al. ................ | 361/685 |
| 2010/0033931 A1 * | 2/2010 | Miyazawa et al. ............ | 361/696 |
| 2011/0302429 A1 * | 12/2011 | Wang et al. ................... | 713/300 |

* cited by examiner

*Primary Examiner* — Rexford Barnie
*Assistant Examiner* — Rasem Mourad
(74) *Attorney, Agent, or Firm* — CKC & Partners Co., Ltd.

(57) ABSTRACT

A server rack system includes a rack, a power transmission module, a power supply module, and operating units. The power transmission module configured at the rack includes first, second, and third conductive pillars. When the power supply module slidably configured in the rack is completely installed in the rack, the power supply module electrically connects the first, second, and third conductive pillars to receive high-voltage direct-current (DC) electric power through the first conductive pillar electrically connecting an external power supply. When the operating units slidably configured in the rack are completely installed in the rack, the operating units electrically connect the second and third conductive pillars. The completely installed operating units transmit signals indicating the complete installation to the power supply module, such that the power supply module converts the high-voltage DC electric power into low-voltage DC electric power and transmits the low-voltage DC electric power to the operating units.

10 Claims, 3 Drawing Sheets

SERVER RACK SYSTEM

CROSS-REFERENCE TO RELATED APPLICATION

This application claims the priority benefit of China application serial no. 201110097513.5, filed on Apr. 13, 2011. The entirety of the above-mentioned patent application is hereby incorporated by reference herein and made a part of this specification.

BACKGROUND OF THE INVENTION

1. Field of the Invention

The invention relates to a rack system, and particularly relates to a server rack system.

2. Description of Related Art

A server is the core which serves all the computers in a network system and has the functions of providing network users with discs, printing services, and so forth. Meanwhile, the server allows the users to share the resources in the network. The basic framework of the server is approximately the same as that of an ordinary personal computer and includes a central processing unit (CPU), a memory, and input/output (I/O) equipment, which are connected by a bus inside. Through north bridge chips, the CPU and the memory are connected, and through south bridge chips, the I/O equipment is connected. Based on the structure of a chassis, the development of the server may be roughly divided into three phases: the early tower chassis, the rack mountable chassis characterized by the concentration property, and the blade server characterized by high-density calculation.

The rack server given as an example here has the standard exterior and is used together with the chassis. In other words, the rack server is a tower server that has an improved framework and is designed to reduce the space occupied by the server as much as possible. Many specialized network equipment adopts the rack mountable structure, which is mostly a flat-type structure shaped as a drawer. The aforesaid network equipment includes exchangers, routers, hardware firewalls, etc, for instance. The width of the rack server is 19 inches, and the height of the rack server is measured by the unit U (1 U=1.75 inches=44.45 millimeters). In general, the standard server has the height of 1 U, 2 U, 3 U, 4 U, 5 U, or 7 U.

The size of the chassis is also regulated by industrial standards, generally from 22 U to 42 U. Detachable sliding trays are configured in the chassis based on the height (U) of the chassis. The user may flexibly adjust the height of the chassis according to the height of the server for storing network equipment, such as the server, a hub, a disc array cabinet, and so forth. After the server is placed, all the I/O wires thereof are led out from the rear of the chassis and organized in the wire trenches of the chassis (all the interfaces of the rack server are also located at the rear). Number labels are commonly used to facilitate management of the wires.

In general, operating units in the conventional rack server are connected to an external power supply and external devices through power cords and local area network (LAN) cables. With the increasing density of calculation and storage devices in the chassis, the increasing LAN cables and power cords cannot be organized or plugged/unplugged with ease. Besides, the cables that are piled up behind the chassis obstruct air ventilation and heat dissipation.

SUMMARY OF THE INVENTION

The invention is directed to a server rack system in which the number of cables is reduced.

In an embodiment of the invention, a server rack system that includes a rack, a power transmission module, a power supply module, and a plurality of operating units is provided. The rack has a plurality of pairs of guiding rails. Besides, the rack has a front end and a rear end opposite to the front end. The power transmission module includes at least one first conductive pillar, at least one second conductive pillar, and a third conductive pillar. The first conductive pillar is configured at the rear end of the rack and electrically connected to an external power supply. The second conductive pillar is configured at the rear end of the rack. The third conductive pillar is configured at the rear end of the rack as well. The power supply module is adapted for sliding into the rack from the front end and is slidably configured on one of the pairs of the guiding rails. When the power supply module is completely installed in the rack, the power supply module is electrically connected to the first conductive pillar, the second conductive pillar, and the third conductive pillar. The power supply module receives high-voltage direct-current (DC) electric power from the external power supply through the first conductive pillar. The operating units are adapted for sliding into the rack from the front end of the rack and are slidably configured on the guiding rails. When the operating units are completely installed in the rack, the operating units are electrically connected to the second conductive pillar and the third conductive pillar respectively. When one of the operating units is completely installed in the rack, the completely installed operating unit transmits a signal indicating the complete installation to the power supply module through the third conductive pillar, and the power supply module converts the high-voltage DC electric power into low-voltage DC electric power based on the signal indicating the complete installation and transmits the low-voltage DC electric power to the operating units through the second conductive pillar.

According to an embodiment of the invention, the operating units include a plurality of servers, and the servers convert the low-voltage DC electric power into a standby voltage after receiving the low-voltage DC electric power through the second conductive pillar, such that the servers enter a standby state.

According to an embodiment of the invention, the operating units further include at least one peripheral module. The peripheral module receives the low-voltage DC electric power through the second conductive pillar and enters an operating state.

According to an embodiment of the invention, when any of the servers is booted, the booted server transmits a boot signal to the power supply module through the third conductive pillar. The power supply module adjusts power supply based on the boot signal and transmits a power ready signal to the booted server through the third conductive pillar. After receiving the power ready signal, the booted server converts the low-voltage DC electric power into an operating voltage, and the booted server is turned on and enters an operating state.

According to an embodiment of the invention, a direction of the guiding rails is horizontal, and the first conductive pillar, the second conductive pillar, and the third conductive pillar are extended from a top of the rack to a bottom of the rack along a vertical direction.

According to an embodiment of the invention, the number of the at least one first conductive pillar is two, and the number of the at least one second conductive pillar is two as well.

According to an embodiment of the invention, at least three metal elastic tabs are configured at a back side of the power supply module, and the metal elastic tabs respectively correspond to the first conductive pillar, the second conductive pillar, and the third conductive pillar. When the power supply module slides into the rack along a corresponding one of the pairs of the guiding rails and is completely installed, the power supply module is in contact with the first, second, and third conductive pillars through the metal elastic tabs, such that the power supply module is electrically connected to the first, second, and third conductive pillars.

According to an embodiment of the invention, the metal elastic tabs are clamping members that protrude from the back side of the power supply module. When the power supply module slides into the rack along the corresponding pair of the guiding rails and is completely installed, each of the clamping members clamps the corresponding first, second, and third conductive pillars.

According to an embodiment of the invention, each of the operating units has at least two metal elastic tabs respectively corresponding to the second and third conductive pillars. When each of the operating units slides into the rack along a corresponding one of the pairs of the guiding rails and is completely installed, each of the operating units is in contact with the second and third conductive pillars through the metal elastic tabs, such that each of the operating units is electrically connected to the second and third conductive pillars.

According to an embodiment of the invention, the metal elastic tabs are clamping members, each of which protrudes from a back side of one of the operating units. When each of the operating units slides into the rack along the corresponding pair of the guiding rails and is completely installed, each of the clamping members clamps the corresponding second and third conductive pillars.

To sum up, the first, second, and third conductive pillars are configured at the rear end of the rack in the server rack system, such that an external power supply can transmit high-voltage DC electric power to the power supply module through the first conductive pillar, and the power supply module supplies power to each of the operating units through the second conductive pillar based on the signal transmitted by the third conductive pillar. Thereby, the number of cables in the server rack system can be reduced, which simplifies the cable organization procedure. Moreover, air circulation within the server rack system is improved, and so is heat-dissipating efficiency.

Other features and advantages of the invention will be further understood from the further technological features disclosed by the embodiments of the invention wherein there are shown and described embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
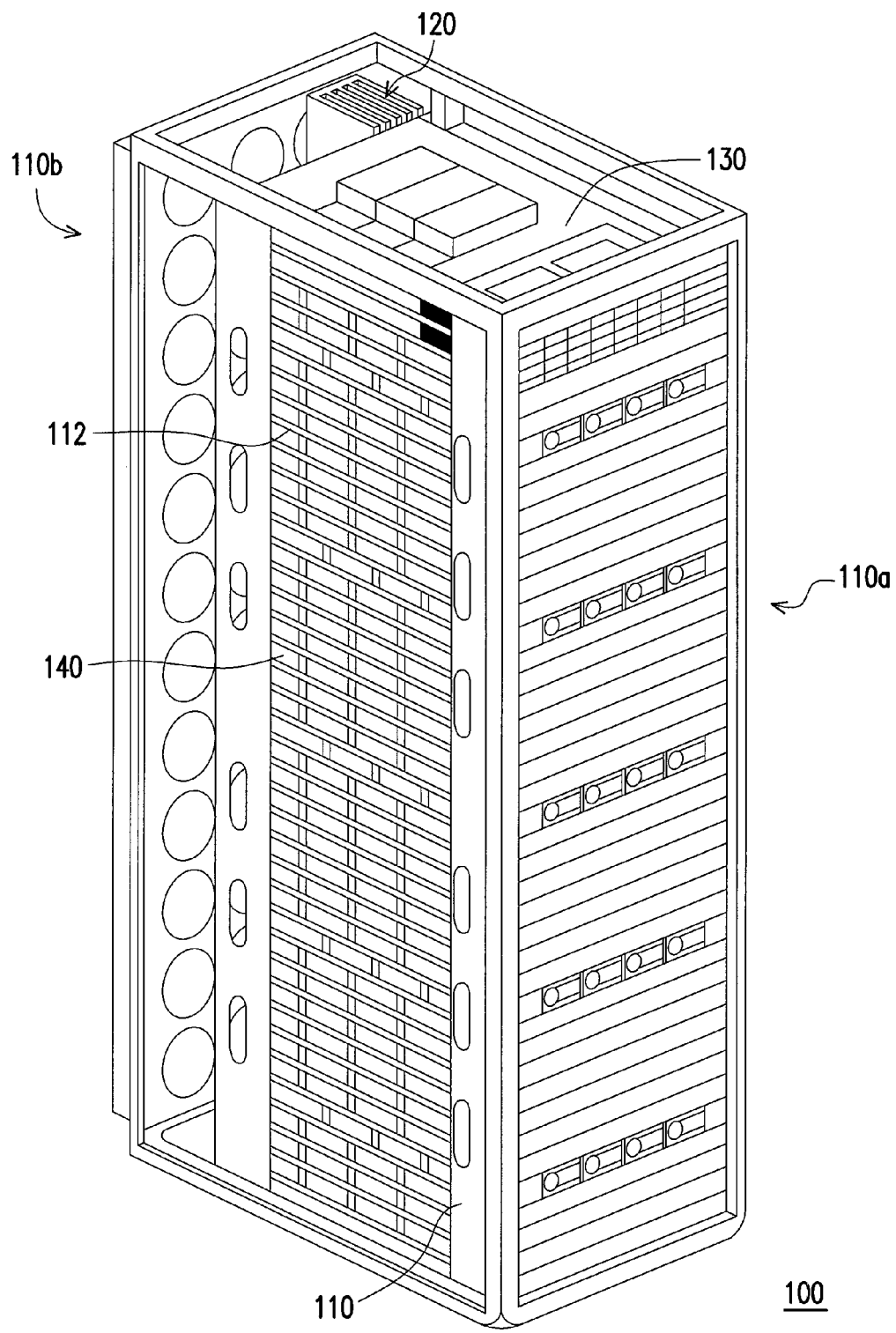
FIG. 1 is a three-dimensional view illustrating a server rack system according to an embodiment of the invention.
Figure 2:
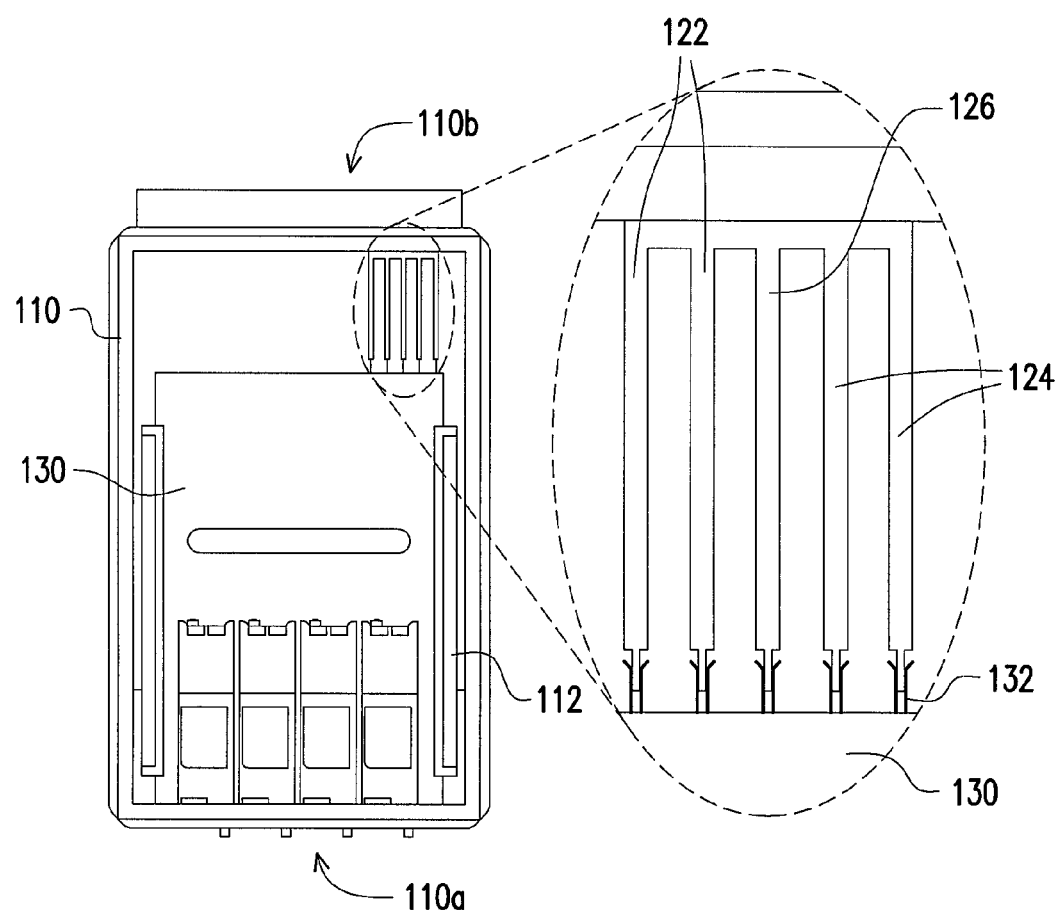
FIG. 2 is a top view illustrating some components in the server rack system depicted in FIG. 1.
Figure 3:
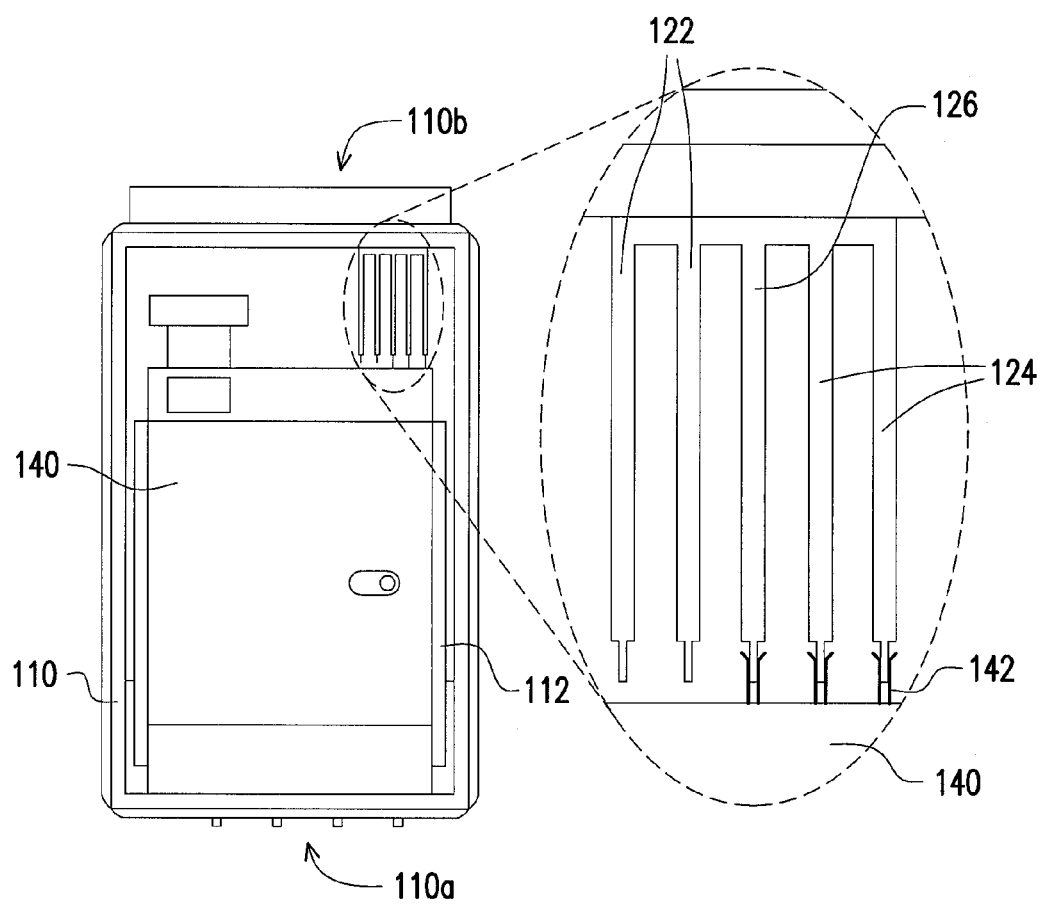
FIG. 3 is a top view illustrating some components in the server rack system depicted in FIG. 1.

FIG. 1 is a three-dimensional view illustrating a server rack system according to an embodiment of the invention. FIG. 2 is a top view illustrating some components in the server rack system depicted in FIG. 1. FIG. 3 is a top view illustrating some components in the server rack system depicted in FIG. 1. With reference to FIG. 1 to FIG. 3, the server rack system 100 of this embodiment includes a rack 110, a power transmission module 120, a power supply module 130, and a plurality of operating units 140. The rack 110 has a plurality of pairs of guiding rails 112. Besides, the rack 110 has a front end 110a and a rear end 110b opposite to the front end 110a.

The power transmission module 120 includes at least one first conductive pillar 122, at least one second conductive pillar 124, and a third conductive pillar 126. In the drawings, two first conductive pillars 122 and two second conductive pillars 124 are shown. The first conductive pillars 122 are configured at the rear end 110b of the rack 110 and electrically connected to an external power supply. The second conductive pillars 124 and the third conductive pillar 126 are configured at the rear end 110b of the rack 110. The power supply module 130 is adapted for sliding into the rack 110 from the front end 110a and being slidably configured on one pair of the guiding rails 112. In FIG. 1, the power supply module 130 is slidably configured on the topmost guiding rail 112. When the power supply module 130 is completely installed in the rack 110 as shown in FIG. 2, the power supply module 130 is electrically connected to the first conductive pillars 122, the second conductive pillars 124, and the third conductive pillar 126 and receives high-voltage DC electric power transmitted from the external power supply through the first conductive pillars 122.

The operating units 140 are adapted for sliding into the rack 110 from the front end 110a and slidably configured on the guiding rails 112, respectively. Besides, when the operating units 140 are completely installed in the rack 110, as shown in FIG. 3, the operating units 140 are electrically connected to the second conductive pillars 124 and the third conductive pillar 126 respectively. When one of the operating units 140 is completely installed in the rack 110, the completely installed operating unit 140 transmits a signal indicating the complete installation to the power supply module 130 through the third conductive pillar 126, and the power supply module 130 converts the high-voltage DC electric power into low-voltage DC electric power based on the signal indicating the complete installation and transmits the low-voltage DC electric power to the operating units 140 through the second conductive pillars 124, such that power can be supplied to the operating units 140.

In view of the aforesaid configuration, the first, second, and third conductive pillars 122, 124, and 126 are configured at the rear end 110b of the rack 110 in the server rack system 100, such that an external power supply can transmit high-voltage DC electric power to the power supply module 130 through the first conductive pillars 122, and the power supply module 130 supplies power to each of the operating units 140 through the second conductive pillars 124 based on the signal transmitted by the third conductive pillar 126. Thereby, the number of cables in the server rack system 100 can be reduced, which simplifies the cable organization procedure. Moreover, air circulation within the server rack system 100 is improved, and so is heat-dissipating efficiency.

In this embodiment, several of the operating units 140 are servers. After receiving the low-voltage DC electric power from the second conductive pillars 124, the servers convert the low-voltage DC electric power into a standby voltage and enter a standby state. When any of the servers is booted, the booted server transmits a boot signal to the power supply module 130 through the third conductive pillar 126. The power supply module 130 adjusts power supply based on the boot signal and then transmits a power ready signal to the booted server through the third conductive pillar 126. After receiving the power ready signal, the booted server converts the low-voltage DC electric power into an operating voltage, and the booted server is turned on and enters an operating state. In addition, at least one of the operating units 140 is a peripheral module according to this embodiment. The peripheral module is adapted for receiving the low-voltage DC electric power through the second conductive pillars 124 and enters an operating state. To be more specific, the peripheral module is a management unit that manages each signal of the server rack system 100, for instance.

In this embodiment, a direction of the guiding rails 112 is horizontal, and the first conductive pillars 122, the second conductive pillars 124, and the third conductive pillar 126 are extended from a top of the rack 110 to a bottom of the rack 110 along a vertical direction. In order to improve the power transmission efficiency, the number of the at least one first conductive pillar 122 is two, and the number of the at least one second conductive pillar 124 is two according to this embodiment. The number of the first and second conductive pillars 122 and 124 is not limited in the invention. Namely, in other embodiments of the invention, the number of the first and second conductive pillars 122 and 124 can be properly determined. According to this embodiment, the power supply module 130 is slidably configured on the topmost pair of guiding rails 112, and the operating units 140 are slidably configured on other pairs of guiding rails 112. However, the invention is not limited thereto. According to other embodiments of the invention, the power supply module 130 and the operating units 140 are adapted for sliding on any pair of the guiding rails 112.

With reference to FIG. 2, in this embodiment, at least three metal elastic tabs 132 are configured at a back side of the power supply module 130, and the metal elastic tabs 132 respectively correspond to the first, second, and third conductive pillars 122, 124, and 126. In FIG. 2, five metal elastic tabs 132 are shown. As indicated in FIG. 2, when the power supply module 130 slides into the rack 110 along one of the pairs of the guiding rails 112 and is completely installed, the power supply module 130 is in contact with the first, second, and third conductive pillars 122, 124, and 126 through the metal elastic tabs 132, such that the power supply module 130 is electrically connected to the first, second, and third conductive pillars 122, 124, and 126. Particularly, the metal elastic tabs 132 of this embodiment are clamping members that protrude from the back side of the power supply module 130. When the power supply module 130 slides into the rack 110 along the corresponding pair of the guiding rails 112 and is completely installed, each of the metal elastic tabs 132 clamps the corresponding first, second, and third conductive pillars 122, 124, and 126, so as to ensure that the first, second, and third conductive pillars 122, 124, and 126 are in secure contact with the corresponding metal elastic tabs 132.

With reference to FIG. 3, in this embodiment, each of the operating units 140 has at least two metal elastic tabs 142, and the metal elastic tabs 142 respectively correspond to the second and third conductive pillars 124 and 126. In FIG. 3, three metal elastic tabs 142 are shown. When the operating units 140 slide into the rack 110 along the corresponding guiding rails 112 (shown in FIG. 3) and are completely installed, the operating units 140 are in contact with the second and third conductive pillars 124 and 126 through the metal elastic tabs 142, such that the operating units 140 are electrically connected to the second and third conductive pillars 124 and 126. Particularly, the metal elastic tabs 142 of this embodiment are clamping members, and each of the clamping members protrudes from the back side of one of the operating units 140. When the operating units 140 slide into the rack 110 along the corresponding guiding rails 112 and are completely installed, the metal elastic tabs 142 clamp the corresponding second and third conductive pillars 124 and 126, so as to ensure that the second and third conductive pillars 124 and 126 are in secure contact with the corresponding metal elastic tabs 142.

In light of the foregoing, the first, second, and third conductive pillars are configured at the rear end of the rack in the server rack system, such that an external power supply can transmit high-voltage DC electric power to the power supply module through the first conductive pillar, and the power supply module supplies power to each of the operating units through the second conductive pillar based on the signal transmitted by the third conductive pillar. Thereby, the number of cables in the server rack system can be reduced, which simplifies the cable organization procedure. Moreover, air circulation within the server rack system is improved, and so is heat-dissipating efficiency.

Although the invention has been described with reference to the above embodiments, it will be apparent to one of the ordinary skill in the art that modifications to the described embodiments may be made without departing from the spirit of the invention. Accordingly, the scope of the invention will be defined by the attached claims rather than by the above detailed descriptions.

What is claimed is:

1. A server rack system comprising:
   a rack having a plurality of pairs of guiding rails, a front end, and a rear end opposite to the front end;
   a power transmission module comprising:
      at least one first conductive pillar configured at the rear end and electrically connected to an external power supply;
      at least one second conductive pillar configured at the rear end; and
      a third conductive pillar configured at the rear end;
   a power supply module adapted for sliding into the rack from the front end and being slidably configured on one of the pairs of the guiding rails, when the power supply module is completely installed in the rack, the power supply module being electrically connected to the at least one first conductive pillar, the at least one second conductive pillar, and the third conductive pillar and receiving high-voltage direct-current electric power from the external power supply through the at least one first conductive pillar; and
   a plurality of operating units adapted for sliding into the rack from the front end and being slidably configured on the guiding rails, when the operating units are completely installed in the rack, the operating units being electrically connected to the at least one second conductive pillar and the third conductive pillar respectively, wherein when one of the operating units is completely installed in the rack, the completely installed operating unit transmits a signal indicating the complete installation to the power supply module through the third conductive pillar, and the power supply module converts the high-voltage direct-current electric power into low-voltage direct-current electric power based on the signal indicating the complete installation and transmits the low-voltage direct-current electric power to the operating units through the at least one second conductive pillar.

2. The server rack system as recited in claim 1, wherein the operating units comprise a plurality of servers, and the servers convert the low-voltage direct-current electric power into a standby voltage after receiving the low-voltage direct-current electric power through the at least one second conductive pillar, such that the servers enter a standby state.

3. The server rack system as recited in claim 2, wherein the operating units further comprise at least one peripheral module, and the at least one peripheral module receives the low-voltage direct-current electric power through the at least one second conductive pillar and enters an operating state.

4. The server rack system as recited in claim 2, wherein when any of the servers is booted, the booted server transmits a boot signal to the power supply module through the third conductive pillar, the power supply module adjusts power supply based on the boot signal and transmits a power ready signal to the booted server through the third conductive pillar, and after receiving the power ready signal, the booted server converts the low-voltage direct-current electric power into an operating voltage, and the booted server is turned on and enters an operating state.

5. The server rack system as recited in claim 1, wherein a direction of the guiding rails is horizontal, and the at least one first conductive pillar, the at least one second conductive pillar, and the third conductive pillar are extended from a top of the rack to a bottom of the rack along a vertical direction.

6. The server rack system as recited in claim 1, wherein the number of the at least one first conductive pillar is two, and the number of the at least one second conductive pillar is two.

7. The server rack system as recited in claim 1, at least three metal elastic tabs being configured at a back side of the power supply module, the at least three metal elastic tabs respectively corresponding to the at least one first conductive pillar, the at least one second conductive pillar, and the third conductive pillar, wherein when the power supply module slides into the rack along a corresponding one of the pairs of the guiding rails and is completely installed, the power supply module is in contact with the at least one first conductive pillar, the at least one second conductive pillar, and the third conductive pillar through the at least three metal elastic tabs, such that the power supply module is electrically connected to the at least one first conductive pillar, the at least one second conductive pillar, and the third conductive pillar.

8. The server rack system as recited in claim 7, wherein the at least three metal elastic tabs are clamping members protruding from the back side of the power supply module, and when the power supply module slides into the rack along the corresponding one of the pairs of the guiding rails and is completely installed, each of the clamping members clamps the at least one first conductive pillar, the at least one second conductive pillar, and the third conductive pillar corresponding to the each of the clamping members.

9. The server rack system as recited in claim 1, each of the operating units having at least two metal elastic tabs respectively corresponding to the at least one second conductive pillar and the third conductive pillar, wherein when the each of the operating units slides into the rack along a corresponding one of the pairs of the guiding rails and is completely installed, the each of the operating units is in contact with the at least one second conductive pillar and the third conductive pillar through the at least two metal elastic tabs, such that the each of the operating units is electrically connected to the at least one second conductive pillar and the third conductive pillar.

10. The server rack system as recited in claim 9, wherein the at least two metal elastic tabs are clamping members, each of the clamping members protrudes from a back side of one of the operating units, and when the each of the operating units slides into the rack along the corresponding one of the pairs of the guiding rails and is completely installed, each of the clamping members clamps the at least one second conductive pillar and the third conductive pillar corresponding to the each of the clamping members.

* * * * *